(12) United States Patent
Park

(10) Patent No.: US 12,197,130 B2
(45) Date of Patent: Jan. 14, 2025

(54) DFR FILM MANUFACTURING SYSTEM

(71) Applicant: Anytape Co., Ltd., Hwaseong-si (KR)

(72) Inventor: Sungho Park, Hwaseong-si (KR)

(73) Assignees: Anytape Co., Ltd., Hwaseong-si (KR); Sungho Park, Hwaseong-si (KR)

( * ) Notice: Subject to any disclaimer, the term of this patent is extended or adjusted under 35 U.S.C. 154(b) by 185 days.

(21) Appl. No.: 17/940,547

(22) Filed: Sep. 8, 2022

(65) Prior Publication Data

US 2023/0091087 A1 Mar. 23, 2023

(30) Foreign Application Priority Data

Sep. 23, 2021 (KR) .......................... 10-2021-0126035

(51) Int. Cl.
 *G03F 7/16* (2006.01)
 *H01F 41/02* (2006.01)

(52) U.S. Cl.
 CPC .............. *G03F 7/16* (2013.01); *H01F 41/02* (2013.01)

(58) Field of Classification Search
 CPC ........................................................ G03F 7/16
 See application file for complete search history.

(56) References Cited

U.S. PATENT DOCUMENTS 5,827,252 A * 10/1998 Werenicz .......... A61F 13/00991
                                                    604/367
2006/0257785 A1* 11/2006 Johnson ................ G03F 7/0385
                                                    430/280.1

FOREIGN PATENT DOCUMENTS

KR            100483242           4/2005

* cited by examiner

*Primary Examiner* — Jeffry H Aftergut
(74) *Attorney, Agent, or Firm* — NKL LAW; Jae Youn Kim

(57) ABSTRACT

A DFR film manufacturing system including: a stirring device for melting and stirring a photoinitiator and an epoxy base thermoplastic resin; a pump station for receiving a mixture in which the photoinitiator and the epoxy-based thermoplastic resin are molted and mixed from the stirring device, and filtering and forcedly transferring impurities; a coating roller for transferring the base film in a state in which the base films get in partially contact with each other; a coating device for coating the received molten mixture on the base film getting in close contact with the coating roller so as to form a DFR layer; a laminating roller for laminating the cover film supplied from the cover film unwinder onto the DFR layer coated on the base film; and a cutting device for cutting the DFR film transferred from the laminating roller.

9 Claims, 12 Drawing Sheets

DFR FILM MANUFACTURING SYSTEM

CROSS REFERENCE

This application claims priority of Korean Patent Application No. 10-2021-0126035 filed with the Korean Intellectual Property Office on 23 Sep. 2021, the entirety which is incorporated herein by reference.

BACKGROUND relates to manufacturing of a dry film photoresist (DFR) film (photosensitive film), and more particularly, to a system and a method for manufacturing a dry film photoresist (DFR) film using a photoinitiator and an epoxy base thermoplastic resin.

In general, a power inductor is a core component required to stably supply electricity (power) coming from a battery to a semiconductor, and is essentially used in a smartphone, a wearable device, an electric vehicle, and the like.

Recently, because IT devices tend to be light, thin, short and small and are increased in the number of components to be mounted due to multifunction and high-performance, such as 5G communication network, multiple cameras, and the like, a space for mounting the components therein is reduced, so that small-sized products are required. In addition, since specifications of components are improved and power consumption is increased, power inductors capable of withstanding high current are required.

Among such power inductors, a micro power inductor for a mobile device, which is 1.2 mm wide and 1.0 mm long, has been developed and commercialized, and recently, an ultra-micro power inductor, which is remarkably reduced in area to be 0.8 mm wide, 0.4 mm long, and 0.65 mm thick, has been developed.

In manufacturing such a power inductor, there is a dry film photoresist (DFR) film as a core element taking up many parts in the entire manufacturing process.

The DFR film required for manufacturing the power inductor is very low in productivity and is very expensive since each process is performed by hand.

Patent Document 1: Korean Patent Publication No. 10-0483242 (published on Apr. 19, 2005)

SUMMARY OF THE INVENTION

Accordingly, the present invention has been made in view of the above-mentioned problems occurring in the prior art, and a DFR film manufacturing system according to the present invention has the following objects.

It is a first object of the present invention to provide a DFR film manufacturing system capable of mass production of DFR films by automation.

It is a second object of the present invention to provide a DFR film manufacturing system capable of cutting DFR films cleanly without crumbling.

It is a third object of the present invention to provide a DFR film manufacturing system capable of automatically and manually adjusting a supply amount of a molten mixture supplied to a coating device.

It is a fourth object of the present invention to provide a DFR film manufacturing system capable of producing mixture in which a free photoinitiator and an epoxy base thermoplastic resin in a 100% gas molten state without bubbles are mixed.

It is a fifth object of the present invention to provide a DFR film manufacturing system capable of coating a DFR layer with desired thickness and width.

It is a sixth object of the present invention to provide a DFR film manufacturing system capable of effectively forming a DFR layer through a spray gap by a dam plate.

It is a seventh object of the present invention to provide a DFR film manufacturing system capable of adjusting a sprayed quantity through the spray gap.

It is an eighth object of the present invention to provide a DFR film manufacturing system capable of easily and conveniently aligning an upper coating block and a lower coating block and easily coupling them.

It is a ninth object of the present invention to provide a DFR film manufacturing system capable of coating the DFR layer unformly at a constant thickness.

It is a tenth object of the present invention to provide a DFR film manufacturing system capable of supplying uniform hot air at appropriate constant temperature (in consideration of a softening point temperature.

It is an eleventh object of the present invention to provide a DFR film manufacturing system capable of accurately and automatically cutting the DFR film into desired shape and size.

It is a twelfth object of the present invention to provide a DFR film manufacturing system capable of easily and conveniently separating DFR film chips cut from the DFR film.

It is a thirteenth object of the present invention to provide a DFR film manufacturing system capable of easily, conveniently and stably picking up separated DFR film chips.

To accomplish the above object, according to the present invention, there is provided a DFR film manufacturing system including: a stirring device for melting and stirring a photoinitiator and an epoxy base thermoplastic resin; a pump station which is connected to the stirring device through a first supply hose, receives a mixture in which the photoinitiator and the epoxy-based thermoplastic resin are molted and mixed from the stirring device, and filters and forcedly transfers impurities; a base film unwinder for supplying a base film wound thereon; a coating roller which is disposed right in front of a coating block of the coating device, and transfers the base films in a state in which the base films get in partially contact with each other so as to change a direction that the base films are supplied from the base film unwinder; a coating device which is connected to the pump station through a second supply hose, receives the molten mixture from the pump station, and coats the received molten mixture on the base film getting in close contact with the coating roller so as to form a DFR layer; a cover film unwinder for supplying a cover film wound thereon; a laminating roller configured to laminate the cover film supplied from the cover film unwinder onto the DFR layer coated on the base film supplied from the coating roller and to transfer the laminated DFR film in a direction in which the cutting device is disposed; and a cutting device for repeatedly cutting the DFR film, which is composed of the base film, the DFR layer, and the cover film transferred from the laminating roller, into a predetermined size to form a plurality of DFR film chips of the same size.

The DFR film manufacturing system according to the present invention has the following effects.

It is a first object of the present invention to provide a DFR film manufacturing system capable of mass production of DFR films by automation.

It is a second object of the present invention to provide a DFR film manufacturing system capable of cutting DFR films cleanly without crumbling.

It is a third object of the present invention to provide a DFR film manufacturing system capable of automatically and manually adjusting a supply amount of a molten mixture supplied to a coating device.

It is a fourth object of the present invention to provide a DFR film manufacturing system capable of producing mixture in which a free photoinitiator and an epoxy base thermoplastic resin in a 100% gas molten state without bubbles are mixed.

It is a fifth object of the present invention to provide a DFR film manufacturing system capable of coating a DFR layer with desired thickness and width.

It is a sixth object of the present invention to provide a DFR film manufacturing system capable of effectively forming a DFR layer through a spray gap by a dam plate.

It is a seventh object of the present invention to provide a DFR film manufacturing system capable of adjusting a sprayed quantity through the spray gap.

It is an eighth object of the present invention to provide a DFR film manufacturing system capable of easily and conveniently aligning an upper coating block and a lower coating block and easily coupling them.

It is a ninth object of the present invention to provide a DFR film manufacturing system capable of coating the DFR layer unformly at a constant thickness.

It is a tenth object of the present invention to provide a DFR film manufacturing system capable of supplying uniform hot air at appropriate constant temperature (in consideration of a softening point temperature.

It is an eleventh object of the present invention to provide a DFR film manufacturing system capable of accurately and automatically cutting the DFR film into desired shape and size.

It is a twelfth object of the present invention to provide a DFR film manufacturing system capable of easily and conveniently separating DFR film chips cut from the DFR film.

It is a thirteenth object of the present invention to provide a DFR film manufacturing system capable of easily, conveniently and stably picking up separated DFR film chips.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Hereinafter, a DFR film manufacturing system according to a preferred embodiment of the present invention will be described in detail with reference to the accompanying drawings.

Figure 1:
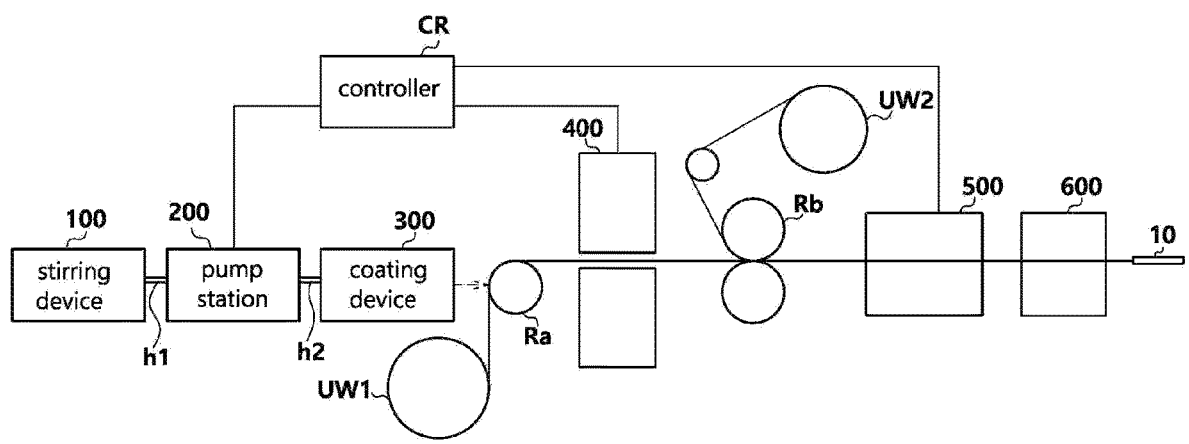
FIG. 1 is a conceptual diagram illustrating a DFR film manufacturing system according to an embodiment of the present invention.
Figure 2:
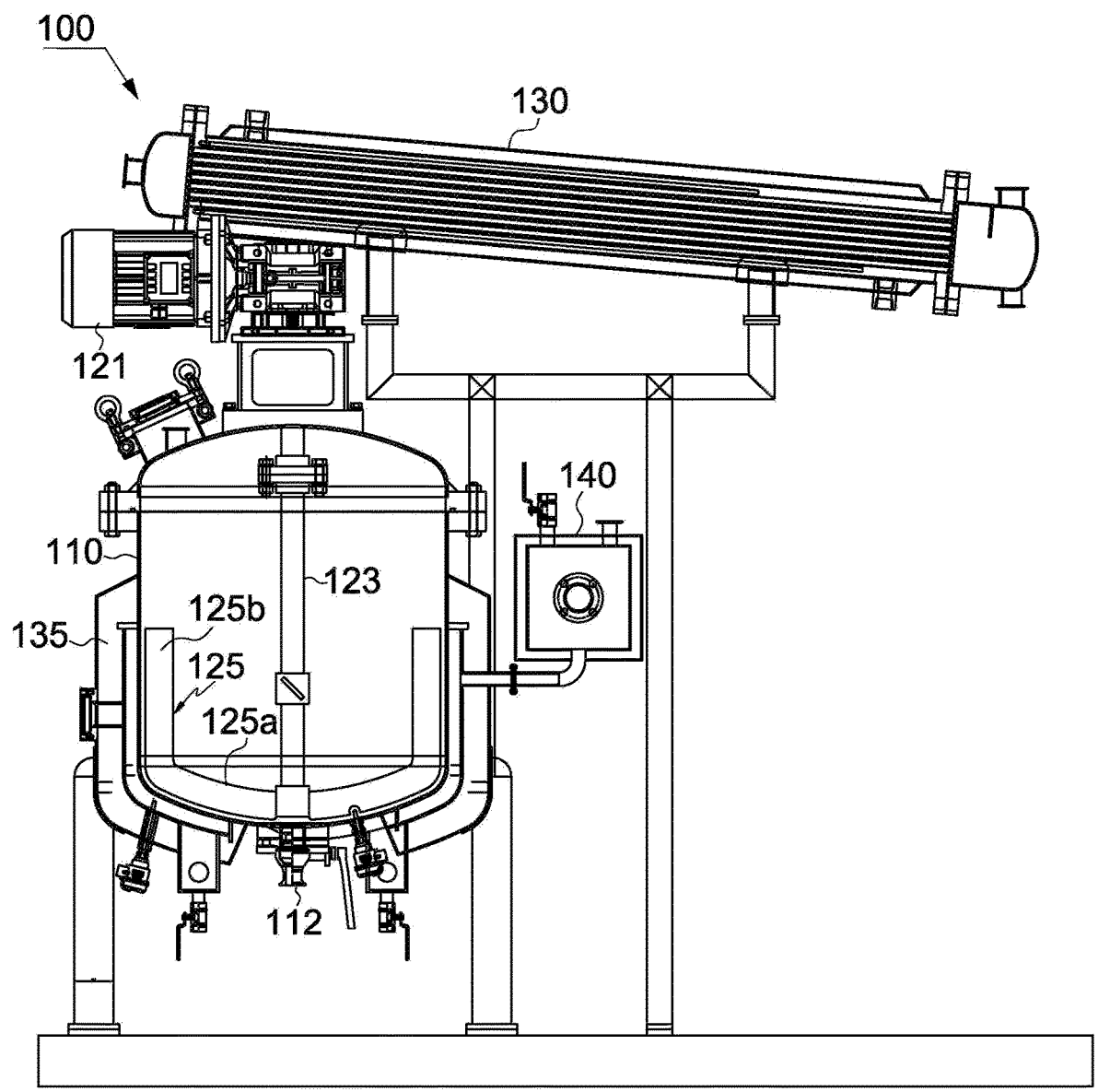
FIG. 2 is a detailed diagram illustrating a configuration of a stirring device 100.
Figure 3:
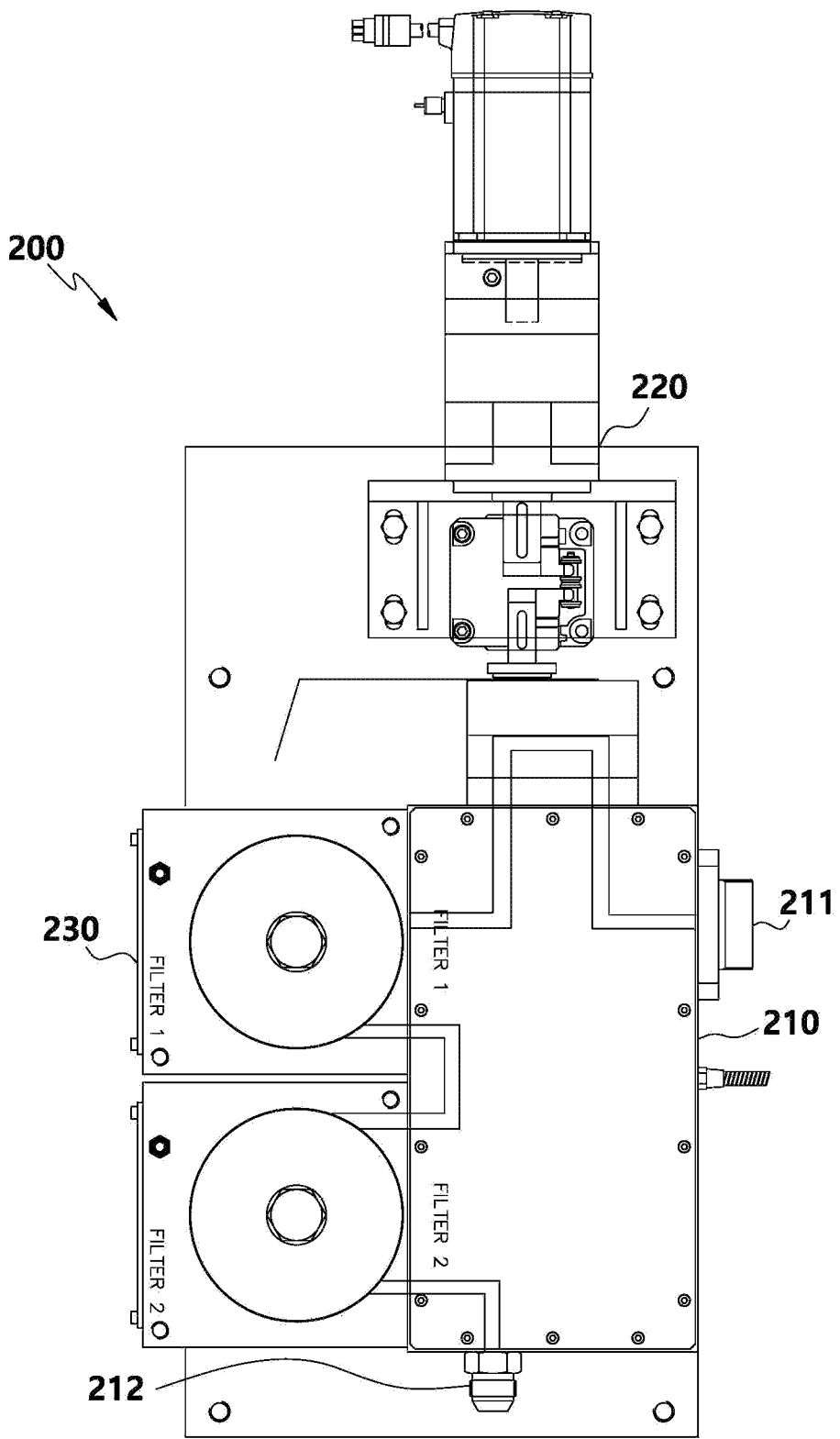
FIG. 3 is a detailed diagram illustrating a configuration of a pump station 200.
Figure 4:
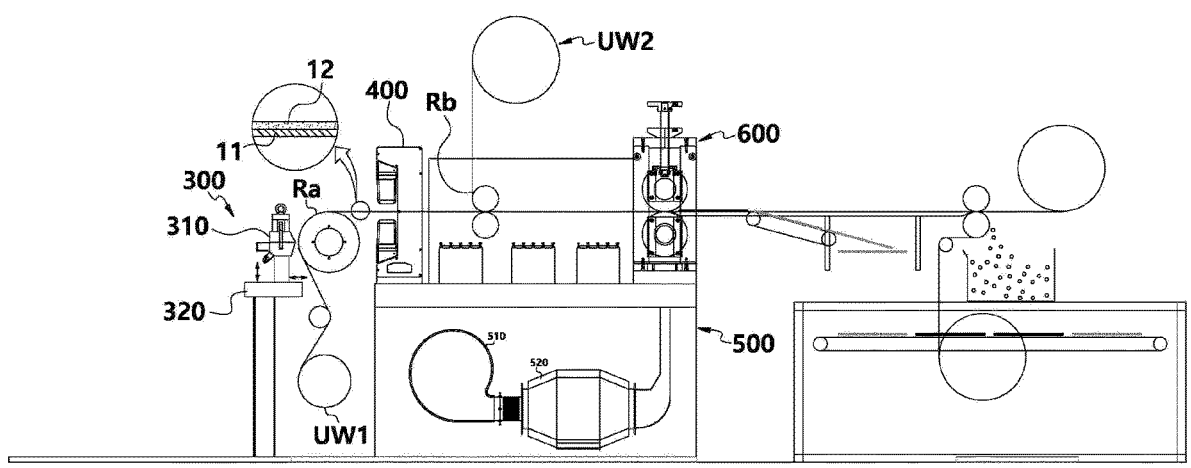
FIG. 4 is a conceptual diagram of a device which receives a molten mixture from the pump station 200, coats a DFR layer 12 on a base film 11, laminates a cover film 13 onto the DFR layer 12, softens the DFR film 10 with hot air, and cuts the DFR film 10 into a predetermined size so as to manufacture DFR film chips 10'.
Figure 5:
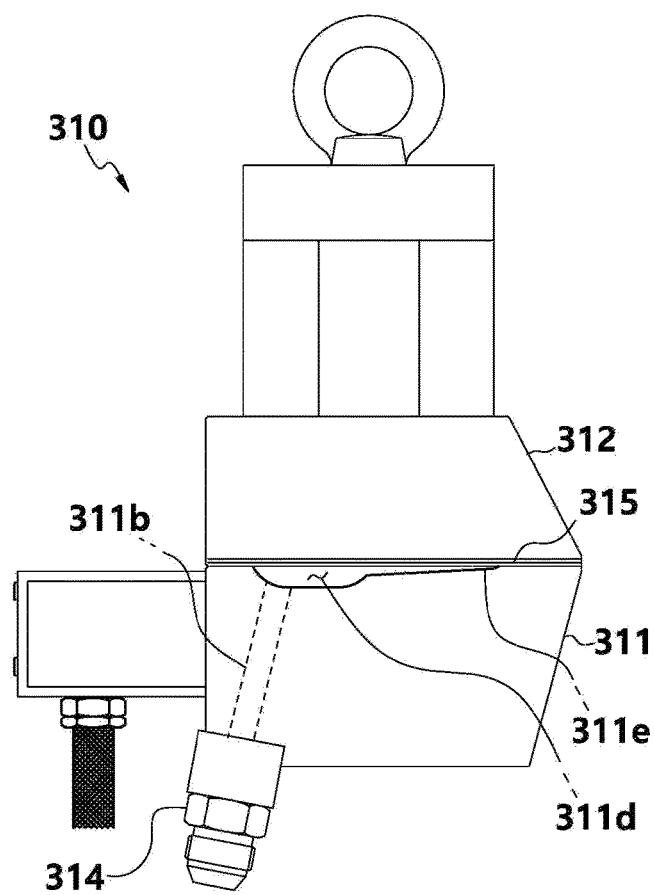
FIG. 5 is a conceptual diagram of a coating device 300.
Figure 6:
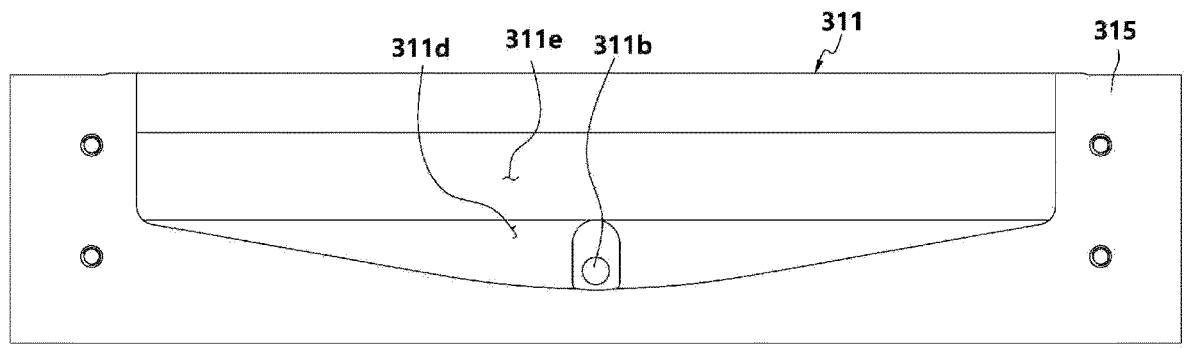
FIG. 6 is a plan view of a lower coating block 311 on which a dam plate 315 is mounted.
Figure 7A:
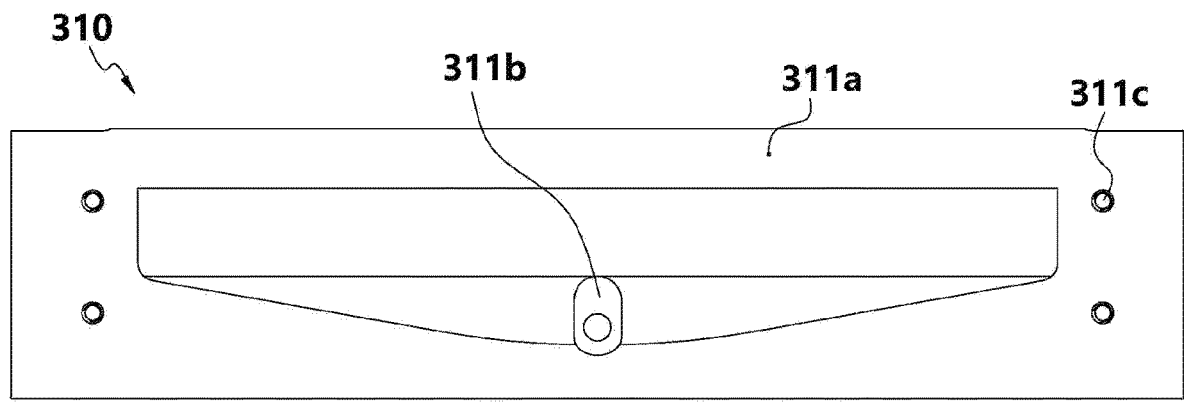
FIG. 7A is an exploded plan view of the lower coating block 311 and FIG. 7B is an exploded plan view of the dam plate 315.
Figure 7B:
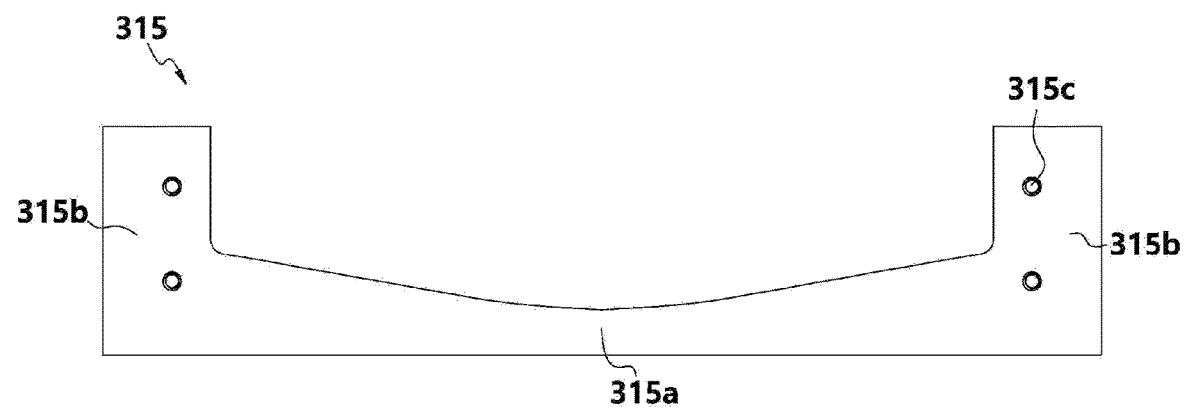
Figure 8:
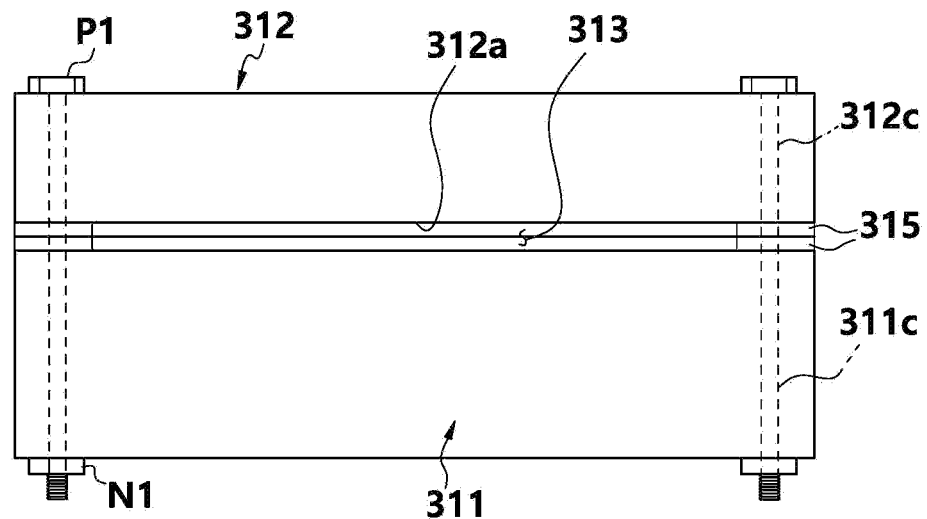
FIG. 8 is a front conceptual view illustrating a configuration of the coating device 300.

As illustrated in FIG. 1, the DFR film manufacturing system according to a preferred embodiment of the present invention includes a stirring device 100, a pump station 200, a base film unwinder UW1, a coating roller Ra, a coating device 300, a cover film unwinder UW2, a laminating roller Rb, and a cutting device 600.

The stirring device 100 is a device for melting and stirring a photoinitiator and an epoxy base thermoplastic resin.

The pump station 200 is connected to the stirring device 100 through a first supply hose h1, receives a mixture in which the photoinitiator and the epoxy-based thermoplastic resin are molted and mixed (hereinafter, referred to as a molten mixture) from the stirring device 100, and filters and forcedly transfers impurities (foreign substances).

The base film unwinder UW1 for supplying a base film 11 wound thereon. Here, the base film 11 may be a PET film.

The coating roller Ra is disposed right in front of a coating block 310 of the coating device 300 (in a forward transfer direction), and transfers the base films 11 in a state in which the base films 11 get in partially contact with each other so as to change a direction that the base films 11 are supplied from the base film unwinder UW1.

The coating device 300 is connected to the pump station 200 through a second supply hose h2, receives the molten mixture from the pump station 200, and coats the received molten mixture on the base film 11 getting in close contact with the coating roller Ra so as to form a DFR layer 12.

The cover film unwinder UW2 on which the cover film 13 is wound supplies the cover film 13 wound on the cover film unwinder. Here, the cover film 13 may be a PET film.

The laminating roller Rb is configured to laminate the cover film 13 supplied from the cover film unwinder UW2 onto the DFR layer 12 coated on the base film 11 supplied from the coating roller Ra and to transfer the laminated DFR film in a direction in which the cutting device is disposed (to the right which is a transfer direction in the drawings).

The cutting device 600 is a device for repeatedly cutting the DFR film 10, which is composed of the base film 11, the DFR layer 12, and the cover film 13, transferred from the laminating roller Rb into a predetermined size to form a plurality of DFR film chips 10' of the same size.

According to the above-described configuration, mass production of DFR films by automation is possible.

The photoinitiator and the epoxy-based thermoplastic resin may be selected from known photoinitiators and known epoxy-based thermoplastic resins.

The photoinitiator of an extremely small amount compared with the epoxy-based thermoplastic resin is mixed since the photoinitiator requires a weight ratio capable of performing a UV reaction.

For example, 0.1 to 3 parts by weight of photoinitiator is used with respect to 100 parts by weight of epoxy-based thermoplastic resin.

The DFR film manufacturing system according to an embodiment of the present invention further includes a hot air supply device 500 disposed at a front end of the cutting device 600 and configured to supply hot air to the DFR film 10 including the base film 11, the DFR layer 12, and the cover film 13 supplied from the laminating roller Rb.

Before the DFR film 10 is cut to the predetermined size, the DFR film 10 is softened in a hot air atmosphere, and the softened DFR film 10 is cut so that the DFR film can be accurately and cleanly cut without being broken.

In a case in which the DFR film 10 is cut at room temperature, the DFR film 10 is well broken due to the properties of the DFR film. However, the DFR film manufacturing system according to the present invention can cut DFR films cleanly by preventing the DFR films from being broken.

The hot air supplied from the hot air supply device 500 is at 45 to 80° C.

The DFR film manufacturing system according to an embodiment of the present invention further includes a thickness measuring device 400 disposed between the coating roller Ra and the laminating roller Rb, measuring the thickness of the DFR layer 12 coated on the base film 11, and outputting a measured current thickness value Tp to a controller CR.

When the thickness of the coated DFR layer 12 is measured, a supply amount of the molten mixture supplied to the coating device 300 can be adjusted.

The stirring device 100 heats and melts the mixture of the photoinitiator and the epoxy base thermoplastic resin, stirs the photoinitiator and the epoxy base thermoplastic resin in a molten state, and removes internal bubbles after stirring.

The stirring device 100 can completely remove even tiny bubbles after removing air generated during melting and mixing processes so as to form a mixture of the photoinitiator and the epoxy base thermoplastic resin in a 100% gas molten state without bubbles.

Now, the main configuration of the stirring device 100 will be described.

The stirring device 100 includes: a stirring tank 110 having an inlet 111 through which a photoinitiator and an epoxy-based thermoplastic resin are introduced and an outlet 112 through which a molten mixture of the molten and stirred photoinitiator and epoxy-based thermoplastic resin is discharged, the stirring tank 110 being a space for stirring the photoinitiator and the epoxy-based thermoplastic resin; a stirring shaft 123 rotatably mounted while penetrating through the upper side of the stirring tank 110; a stirring motor 121 disposed above the stirring tank 110 to rotate the stirring shaft 123; a stirring blade 125 mounted on the stirring shaft 123 to stir and mix the photoinitiator and the epoxy-based thermoplastic resin in the stirring tank 110; a heating member 130 for supplying a heat medium of high temperature; a heat medium pipe 135 attached on the outer circumferential surface of the stirring tank 110 to heat the stirring tank 110 by the heat medium supplied from the heating member 130; and a vacuum pump 140 for forcedly inhaling internal air of the stirring tank 110 to remove bubbles generated during the stirring and mixing process or existing in the stirring tank 110.

As described above, the vacuum pump 140 can completely remove bubbles generated during the melting and stirring processes.

The heating member 130 may be, for instance, a heat exchanger for supplying heat medium heated by heat exchange.

The stirring blade 125 includes a bottom wing 125a, and a vertical wing 125b bent upward from the bottom wing 125a to be spaced apart from an inner circumferential surface of the stirring tank 110.

Accordingly, the present invention can smoothly and effectively stir the molten mixture by easily mixing the mixture getting in close contact with the inner circumferential surface of the stirring tank 110.

Preferably, the melting temperature of the stirring device 100 is in a range of about 120° C. to about 150° C. Next, a main configuration of the pump station 200 will be described.

The pump station 200 includes: a pumping block 210 having an inlet 211 in which the photoinitiator and the epoxy-based thermoplastic resin supplied from the stirring device are mixed and molten, and an outlet 212 through which the molten mixture of the photoinitiator and the epoxy-based thermoplastic resin from which impurities are filtered is discharged; a pump 220 for pumping the molten mixture of the photoinitiator and the epoxy-based thermoplastic resin in the pumping block 210; and a filter block 230 which receives the molten mixture of the photoinitiator and the epoxy-based thermoplastic resin from the pumping block 210, filters impurities, and returns the molten mixture to the pumping block, wherein a supply speed of the molten mixture of the photoinitiator and the epoxy-based thermoplastic resin supplied to the coating device 300 by the action of the pump 220 can be adjusted.

The pump 220 operates a pumping output according to a pumping control signal received from the controller CR.

In an embodiment of the present invention, the DFR film manufacturing system further includes: a thickness measuring device 400 which is disposed between the coating roller Ra and the laminating roller Rb, measures the thickness of the DFR layer 12 coated on the base film 11, and outputs a measured current thickness value Tp to the controller CR; and the controller CR which stores a reference thickness value Tc in an internal memory, receives the current thickness value Tp of the DFR layer 12 from the thickness measuring device 400, compares the received current thickness value Tc with the reference thickness value Tc stored in the internal memory, and outputs a pumping control signal to the pump station 200 (in detail, the pump 220 disposed in the pump station) according to a difference between the current thickness value Tc and the reference thickness value Tc).

The pump station 200 (in detail, the pump 220 disposed in the pump station) performs pumping according to the pumping control signal from the controller CR.

The pumping control signal output by the controller CR according to a difference between the current thickness value Tc and the reference thickness value Tc is a pumping decrease control signal for decreasing operational output of the pump of the pump station in a case in which the current thickness value Tc is larger than the reference thickness value Tc, but is a pumping increase control signal for increasing operational output of the pump of the pump station in a case in which the current thickness value Tc is smaller than the reference thickness value Tc.

Next, the coating device 300 will be described in detail.

The coating device 300 includes: a coating block 310 for receiving the molten mixture from the pump station 200 and spraying the molten mixture to the base film 11; and a moving block 320 for moving the coating block 310 in the vertical direction, in the back-and-forth direction, and in the horizontal direction.

The coating block 310 includes a lower coating block 311 and an upper coating block 312 coupled to an upper side of the lower coating block 311. The lower coating block 311 has an inlet 314 connected with the second supply hose h2 of the pump station 200, and the inlet 314 has a supply hole 311b communicating with the inlet 314 and perforating through the upper surface of the lower coating block 311. A spray gap 313 is formed between an upper surface 311a of the lower coating block 311 and a lower surface 312a of the upper coating block 312. The molten mixture supplied to the supply hole 311b is sprayed through the spray gap 313 to coat the base film 11.

The coating device 300 further includes a dam plate 315 interposed between the lower coating block 311 and the upper coating block 312, formed in a 'ㄷ' shape to block the right and left side and the rear side of a space between the lower coating block 311 and the upper coating block 312, and having an outlet for the supply hole 311b therein. The spray gap 313 is formed between the lower coating block 311 and the upper coating block 312 by the dam plate 315. The molten mixture supplied through the supply hole 311b is charged in a space formed by the dam plate 315, the upper surface 311a of the lower coating block 311, and the lower surface 312a of the upper coating block 312, and then, is sprayed through the spray gap 313.

In the coating device 300, the dam plate 315 includes a rear portion 315a and a pair of right and left side portions 315b bent forward and extending from left and right ends of the rear portion 315a. The outlet of the supply hole 311b is disposed inside the rear portion 315a and the pair of side portions 315b.

The spray amount sprayed through the spray gap 313 and coated on the base film 11 can be adjusted by the number of the dam plates 315 interposed between the upper surface 311a of the lower coating block 311, and the lower surface 312a of the upper coating block 312.

Therefore, the spray amount can be easily and conveniently adjusted.

The lower coating block 311 has a plurality of lower fastening holes 311c formed therethrough in a vertical direction, and a plurality of upper fastening holes 312c formed in the upper coating block 312 in a vertical direction to communicate with the lower fastening holes 311c at the same position, and the dam plate 315 has a plurality of fastening holes 315c to communicate with the lower fastening holes 311c and the upper fastening holes 312c.

The coating device 300 has a fastening bolt P1 and a fastening nut N1 for sequentially fastening the upper fastening holes 312c, the fastening holes 315c, and the lower fastening holes 311c.

Accordingly, it is possible to easily and conveniently align and fasten the upper coating block 312 and the lower coating block 311.

The upper surface 311a of the lower coating block 311 includes the outlet of the supply hole 311b so that a buffer groove 311d is recessed downward, and a guide inclined surface 311e is formed to be inclined upward from the buffer groove 311d toward the front end side of the upper surface 311a of the lower coating block 311.

Accordingly, even though the molten mixture supplied from the pump station 200 is supplied at high pressure, since the molten mixture is sprayed after supply pressure is buffered at the buffer groove 311d, it is possible to coat the DFR layer 12 with a uniform thickness by always spraying the molten mixture at constant pressure through the spray gap 313.

In the coating device 300 according to an embodiment of the present disclosure, the dam plate 315 is mounted on the lower coating block 311 to cover the buffer groove 311d and the guide inclined surface 311e, and is interposed between the lower coating block 311 and the upper coating block 312. The inner circumference of the dam plate 315 is formed to coincide with the edges of the buffer groove 311d and the guide inclined surface 311e.

Next, the hot air supply device 500 will be described in detail.

Figure 9:
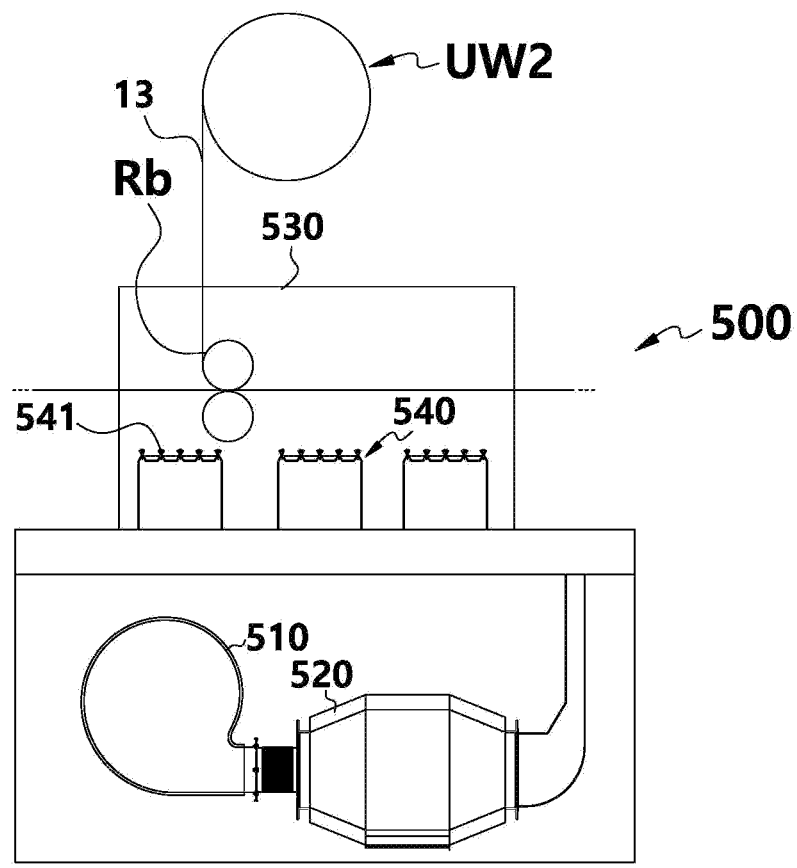
FIG. 9 is a conceptual diagram of a hot air supply device 500.
Figure 10:
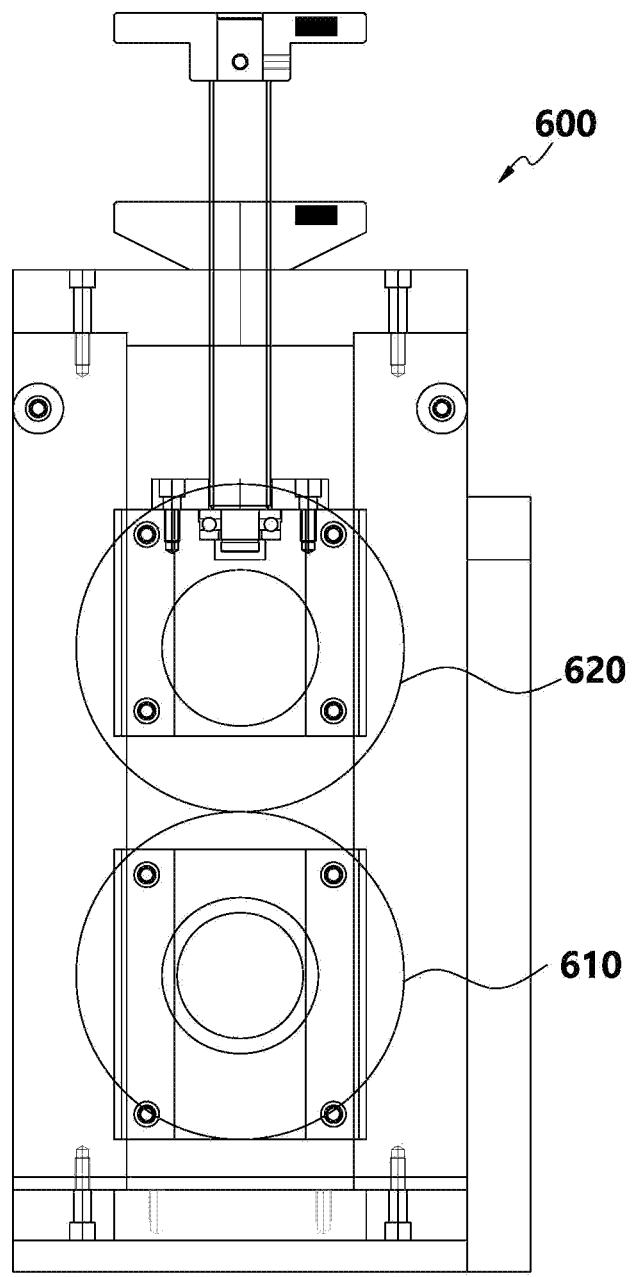
FIG. 10 is a conceptual diagram illustrating a side configuration of a cutting device 600.
Figure 11:
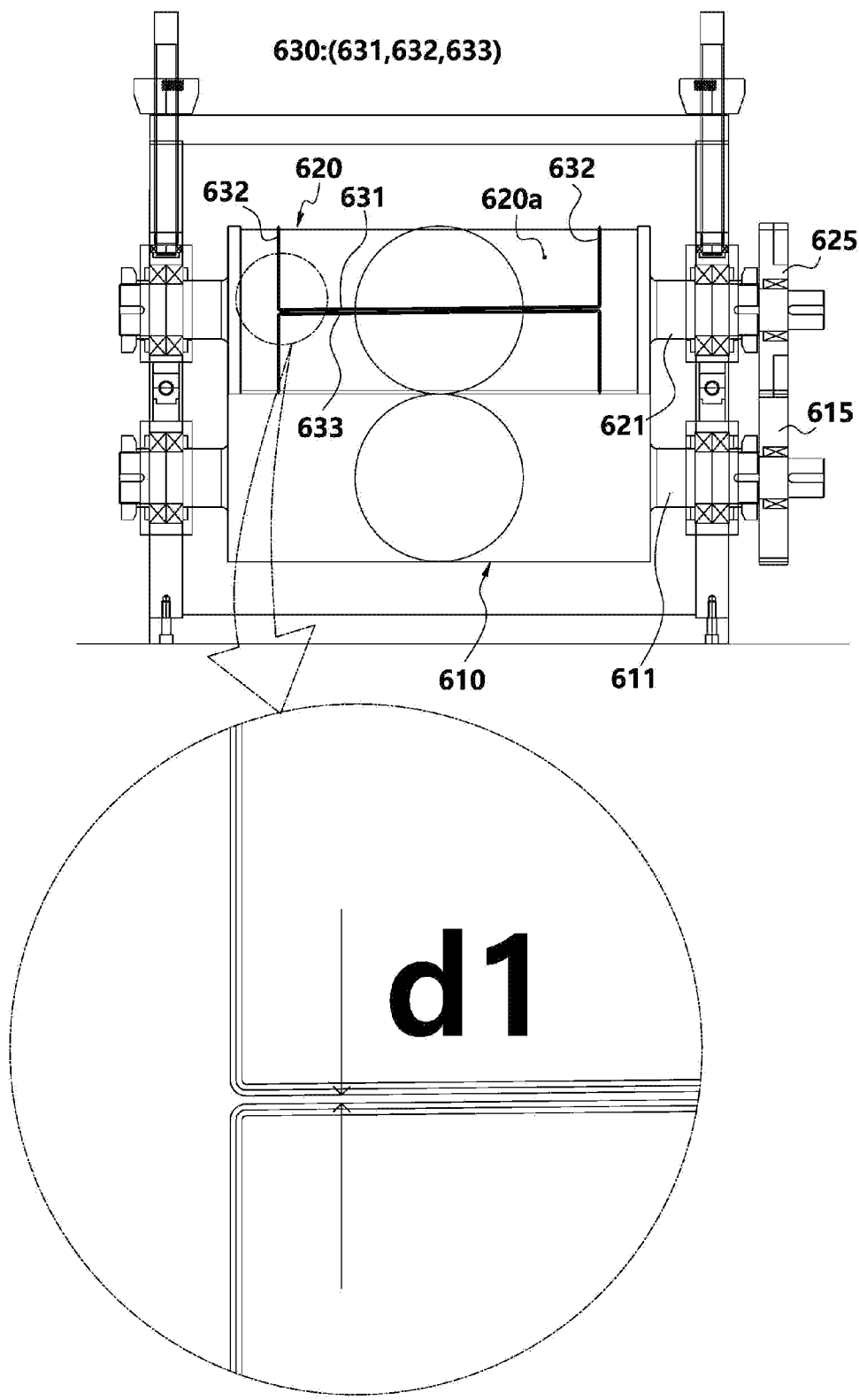
FIG. 11 is a conceptual view illustrating front essential parts of the cutting device 600.
Figure 12:
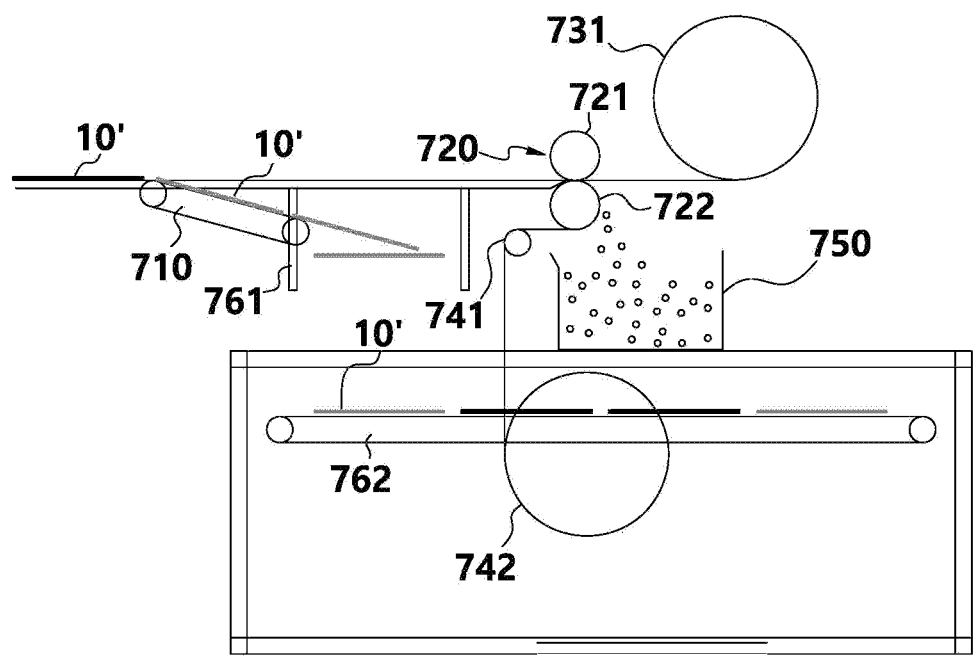
FIG. 12 is a conceptual diagram illustrating a configuration of a device for separating and picking up DFR film chips 10' cut into the predetermined size by the cutting device 600.

The hot air supply device 500 includes: a blower 510; a heater box 520 having a heater member (not shown) embedded therein to convert wind introduced from the blower 510 into hot air and discharge the hot air to a nozzle device 540; the nozzle device having a plurality of nozzles 541, and receiving the hot air from the heater box 520 to supply the hot air to a hot air chamber 530 through the nozzles 541; and the hot air chamber 530 having an inlet (not shown) which is formed at one side (left side in FIG. 9) and through which the DFR film 10 or the base film 11 coated with the DFR layer 12 is introduced, and an outlet (not shown) which is formed at the other side (right side in FIG. 9) and through which the DFR film 10 softened by the hot air is discharged, and including a space for softening the DFR film 10 at appropriate temperature by the hot air supplied from the nozzle device 540.

Since the DFR film 10 is transferred into the hot air chamber 530 for supplying hot air, and is cut at appropriate constant temperature (in consideration of a softening point temperature that the DFR film is not completely softened but is almost softened to be cut easily, and the temperature has the same meaning in the entire specification).

The laminating roller Rb is mounted inside the hot air chamber 530, and the cover film 13 and the DFR layer 12 are laminated in a softening temperature atmosphere of the DFR film 10.

In this case, the film introduced through the inlet (not shown) of the hot air chamber 530 is the base film 11 on which the DFR layer 12 is formed, and the film withdrawn through the outlet (not shown) of the hot air chamber 530 is the DFR film 10 in which the cover film 13 is laminated.

The nozzle device 540 is disposed in the hot air chamber 530 to be located right below the DFR film to face the DFR film 10.

The hot air supply device 500 according to an embodiment of the present invention further includes a chamber temperature sensor (not shown) which is adjacent to the DFR film 10 at the rear end of the laminating roller Rb inside the hot air chamber 530, senses internal temperature of the hot air chamber 530, and outputs the sensed internal temperature of the hot air chamber 530 to the controller CR.

The internal memory (not shown) of the controller CR stores a reference softening point temperature Ts of the DFR film 10 and a reference temperature deviation value ΔTs.

The controller CR compares a current chamber temperature Tq received from the chamber temperature sensor with the stored reference softening point temperature Ts, calculates a difference between the reference softening point temperature Ts and the current chamber temperature Tq in a case in which the reference softening point temperature Ts is different from the current chamber temperature Tq, and controls the operation of a heater inside the heater box 520 so that the difference value ΔTs between the reference softening point temperature Ts and the current chamber temperature Tq becomes below the stored reference temperature deviation value ΔTs in a case in which the difference value ΔTs between the reference softening point temperature Ts and the current chamber temperature Tq is higher than the reference temperature deviation value ΔTs.

Here, the phrase, "to control the operation of a heater inside the heater box 520 so that the difference value ΔTs between the reference softening point temperature Ts and the current chamber temperature Tq becomes below the stored reference temperature deviation value ΔTs in a case in which the difference value ΔTs between the reference softening point temperature Ts and the current chamber temperature Tq is higher than the reference temperature deviation value ΔTs", means to control the operation of the heater to lower the heating temperature of the internal heater of the heater box 520 since chamber temperature is too high in a case in which the current chamber temperature Tq is higher than the sum of the reference softening point temperature Ts and the reference temperature deviation value ΔTs, and control the operation of the heater to raise the heating temperature of the internal heater of the heater box 520 since chamber temperature is too low in a case in which the current chamber temperature Tq is lower than the difference of the reference softening point temperature Ts and the reference temperature deviation value ΔTs.

Next, the cutting device 600 will be described in detail.

The cutting device 600 according to an embodiment of the present disclosure includes a lower roller 610 which is rotatable and an upper roller 620 rotating in conjunction with the lower roller 610. The DFR film 10 is interposed between the lower roller 610 and the upper roller 620 so that the DFR film 10 is transferred in one direction (to the right in the drawing) by the rotation of the upper roller 620 and the lower roller 610.

A cutting blade 630 is embossed along the outer circumference surface 620a of the upper roller 620 in a rectangular shape. The upper roller 620 is mounted on the lower roller 610 so that the cutting blade 630 embossed along the outer circumference surface 620a of the upper roller 620 gets in contact with the outer circumferential surface of the lower roller 610. The DFR film 10 is cut in the rectangular shape of the cutting blade 630 when the upper roller 620 rotates once, namely, one pitch rotation, so as to produce DFR film chips 10'.

A rotation driving means for actually rotating the lower roller 610 and the upper roller 620 may be further included.

The rotation driving means includes: a lower rotation shaft 611 disposed on the lower roller 610; an upper rotation shaft 621 disposed on the upper roller 620; a lower driving gear 615 mounted on the lower rotation shaft 611; an upper driving gear 625 mounted on the upper rotation shaft 621; and a motor (not shown) for rotating the lower driving gear 615 and the upper driving gear 625.

The cutting blade 630 includes: a shear blade portion 631 formed at a position where cutting starts; a pair of lateral blade portions 632 parallel to the transfer direction; and a rear blade portion 633 formed at the front end of the lateral blade portion 632 to be spaced apart from the shear blade portion 631 at a distance Dl of the DFR film chips 10' and formed at the rear end of the lateral blade portion 632 to be formed at a position at which the cutting is terminated.

The lateral blade portion 632 is formed inward from the left and right edges of the upper roller 620 so as to be cut more inward than the DFR layer 12.

Hereinafter, an device for picking up the cut DFR film 10 will be described.

The DFR film manufacturing system according to an embodiment of the present invention further includes: a conveying belt 710 mounted to be located at a distance which is the same as or shorter than a length Lc of the cut DFR film chips 10' from the upper roller 620 and the lower roller 610 of the cutting device 600 and inclined downward in the transfer direction so as to receive the DFR film chips 10' and transfer the DFR film chips 10' downwardly when the DFR film chips 10' cut by the cutting action of the cutting blade 630 are separated from the base film 11 and the cover film 13 and do a free fall; a pair of pull-in rollers 720 for exfoliating the base film 11, which falls to the conveying belt 710 and has residues of the DFR layer 12 from which the DFR film chips 10' are separated, the base film 11, which pulls the cover film 13 and has residues of the DFR layer 12, and the base film 11 of the cover film 13; a base film exfoliating roller 741 located below the rear of the pull-in rollers 720 and converting the direction of the base film 11 exfoliated from the pull-in rollers 720 into the downward direction so that the base film 11 is smoothly exfoliated from the pull-in rollers 720; a cover film rewinder 731 for winding the cover film 13 exfoliated from the pull-in rollers 720; and a collection box 750 located beneath the pull-in rollers 720 for collecting residues of the DFR layer separated and falling when the base film 11 and the cover film 13 are separated from each other while passing through the pull-in rollers 720.

The pair of pull-in rollers 720 includes: a driving roller 721 rotating by rotation of a motor (not shown); and an exfoliating roller 722 adjoining a driving roller 721 by interposing the base film 11, which has the residues of the DFR layer 12 from which the DFR film chips 10' are separated, and the cover film 13 between the driving roller 721 and the exfoliating roller 722, and exfoliating the base film 11 by bending backward the base film 11, namely, in the opposite direction to the transfer direction, by the rotation.

The base film exfoliating roller 741 is located at the rear and the bottom of the exfoliating roller 722.

The DFR film manufacturing system according to an embodiment of the present invention further includes: a vertical falling guide 761 spaced apart from the conveying belt 710 and guiding the DFR film chips 10' to guide the DFR film chips 10' transferred and vertically falling from the conveying belt 710 to smoothly and vertically fall to a pick-up belt 762 located above the DFR film chips 10'; and a pick-up belt 762 for transferring the DFR film chips 10' to a pick-up position when the DFR film chips 10' falling according to the guide of the vertical falling guide 761.

Figure 13A:
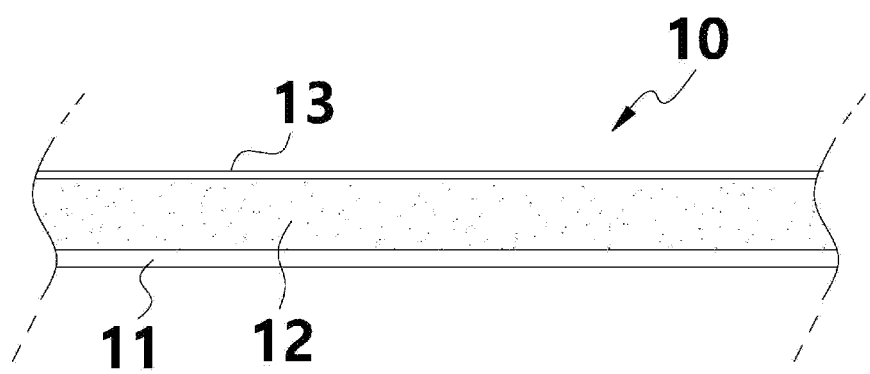
FIG. 13A is a longitudinal cross-sectional view of the DFR film 10.
Figure 13B:
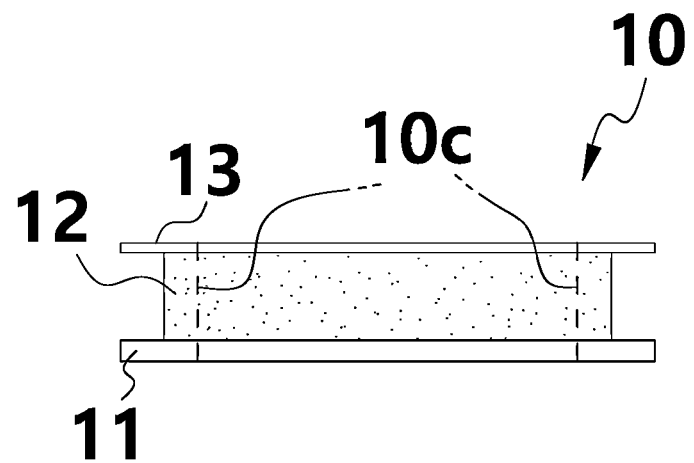
FIG. 13B is a cross-sectional view of the DFR film 10.
Figure 13C:
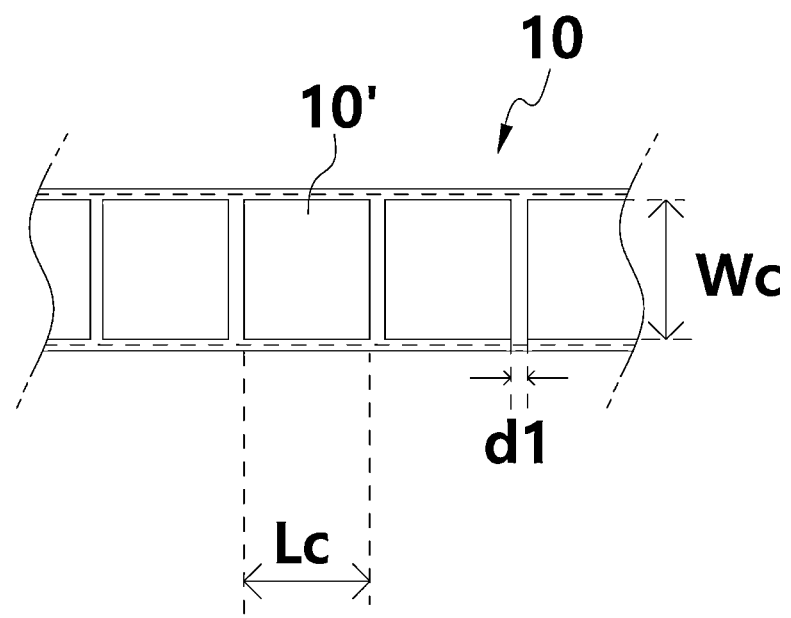
FIG. 13C is a diagram illustrating an operational concept of the DFR film 10 which is cut by the cutting device 600.
Figure 14:
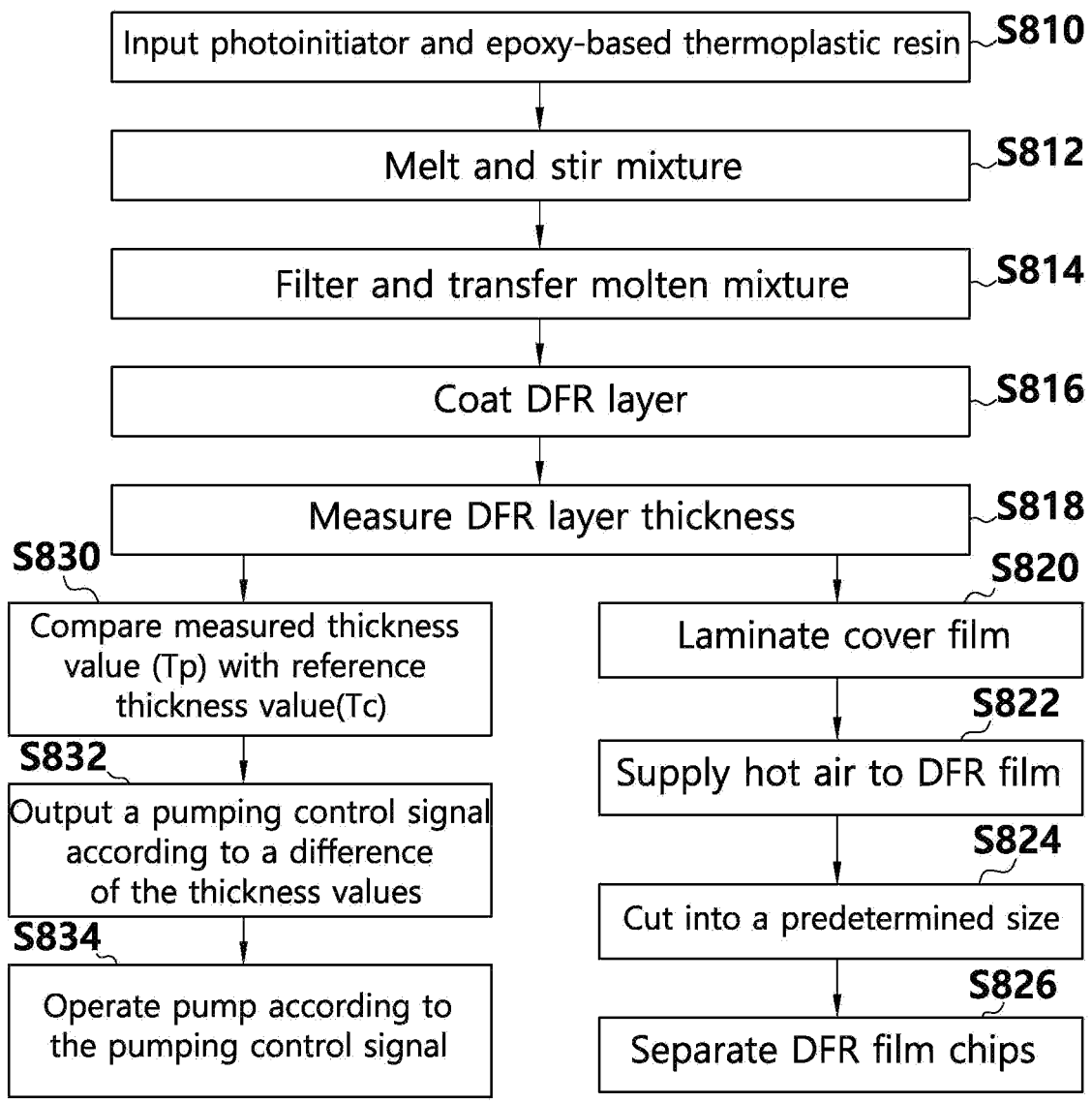
FIG. 14 is a flow chart illustrating a DFR manufacturing method according to an embodiment of the present invention.

Wc illustrated in FIG. 13C means the width of Wc of the DFR film chips 10'.

Next, a DFR film manufacturing method according to an embodiment of the present invention will be described.

First, a photoinitiator and an epoxy-based thermoplastic resin are introduced into the inlet 111 of the stirring tank 110 of the stirring device 100 (S810).

The photoinitiator and the epoxy-based thermoplastic resin are melted and stirred in the stirring tank 110 of the stirring device 100 (S812).

The heat medium supplied from the heating member 130 is transferred to the heat medium pipe 135 so that the stirring tank 110 is heated to melt the photoinitiator and the epoxy-based thermoplastic resin in the stirring tank 110.

The mixture of the photo initiator and the epoxy-based thermoplastic resin in the molten state is stirred by the stirring blade 125.

Moreover, the vacuum pump 140 forcibly inhales the air inside the stirring tank 110 to remove bubbles generated during the mixing and stirring process or existing inside the stirring tank 110.

The pump station 200 receives the molten mixture of the photoinitiator and the epoxy-based thermoplastic resin from the stirring device 100, filters impurities (foreign substances) from the molten mixture of the photoinitiator and the epoxy-based thermoplastic resin, and then, forcibly transfers the filtered impurities to the coating device 300 (S814).

The coating device 300 receives the molten mixture from the pump station 200, and coats the supplied molten mixture on the base film 11 getting in close contact with the coating roller Ra to form a DFR layer 12 (S816).

A thickness measuring step S818 of measuring the thickness of the DFR layer 12 coated on the base film 11 performed in the step S816 is performed.

In addition, a step of laminating the cover film 13 supplied from the cover film unwinder UW2 to the DFR layer 12 coated on the base film 11 supplied from the coating roller Ra is performed by the laminating roller Rb.

After the step S820 of laminating the cover film 13 to the DFR layer 12, a step S822 of supplying hot air to the DFR film 10 passing through the laminating roller Rb is performed.

A step S824 of repeatedly cutting the DFR film 10 composed of the base film 11, the DFR layer 12, and the cover film 13 transferred from the laminating roller Rb into a predetermined size is performed. A plurality of DFR film chips 10' of the same size are made by cutting.

After the step S824 of repeatedly cutting the DFR film 10 into the predetermined size, a step S826 of free-falling the DFR film chips 10' to the conveying belt 710 to separate the DFR film chips 10' from the base film 11 and the cover film 13 is performed.

Meanwhile, a step S830 of comparing a current thickness value Tc measured by the thickness measuring step S818 with a reference thickness value Tc stored in the internal memory of the controller CR is performed.

Furthermore, a step S832 of outputting a pumping control signal to the pump 220 provided in the pump station 200 according to a difference between the is performed according to the difference between the current thickness value Tc and the reference thickness value Tc.

A step S834 of performing a pumping action according to the pumping control signal received from the controller CR by the pump 220 of the pump station 200 is performed.

The foregoing description of the present disclosure has been presented for the purposes of illustration and description. It is apparent to a person having ordinary skill in the art to which the present disclosure relates that the present disclosure can be easily modified into other detailed forms without changing the technical principle or essential features of the present disclosure. Therefore, the foregoing embodiments should be regarded as illustrative rather than limiting in all aspects.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A dry film photoresist film manufacturing system comprising:
   a stirring device for melting and stirring a photoinitiator and an epoxy-based thermoplastic resin;
   a pump station which is connected to the stirring device through a first supply hose, receives a mixture in which the photoinitiator and the epoxy-based thermoplastic resin are molten and mixed from the stirring device;
   a base film unwinder for supplying a base film wound thereon;
   a coating roller which is disposed in front of a coating block of a coating device, and transfers the base film while getting in partial contact with the base film so as to change a direction of the base film supplied from the base film unwinder;
   the coating device which is connected to the pump station through a second supply hose, receives the molten mixture from the pump station, and coats the received molten mixture on the base film getting in contact with the coating roller so as to form a dry film photoresist layer;
   a cover film unwinder for supplying a cover film wound thereon;
   a laminating roller configured to laminate the cover film supplied from the cover film unwinder onto the dry film photoresist layer coated on the base film supplied from the coating roller and to transfer the laminated dry film photoresist film in a direction in which a cutting device is disposed; and
   the cutting device for repeatedly cutting the dry film photoresist film, which is composed of the base film, the dry film photoresist layer, and the cover film transferred from the laminating roller, into a size to form a plurality of dry film photoresist film chips of an equal size,
   the system further comprising:
   a hot air supply device disposed at a front end of the cutting device and configured to supply hot air to the dry film photoresist film including the base film, the dry film photoresist layer, and the cover film supplied from the laminating roller.

2. The dry film photoresist film manufacturing system according to claim 1, further comprising:
   a thickness measuring device disposed between the coating roller and the laminating roller, measuring a thickness of the dry film photoresist layer coated on the base film, and outputting a measured current thickness value to a controller.

3. The dry film photoresist film manufacturing system according to claim 1, wherein the pump station comprises:
   a pumping block having an inlet in which the photoinitiator and the epoxy-based thermoplastic resin supplied from the stirring device are mixed and molten, and an outlet through which the molten mixture of the photoinitiator and the epoxy-based thermoplastic resin from which impurities are filtered is discharged;

a pump for pumping the molten mixture of the photoinitiator and the epoxy-based thermoplastic resin in the pumping block; and a filter block which receives the molten mixture of the photoinitiator and the epoxy-based thermoplastic resin from the pumping block, filters the impurities, and returns the molten mixture to the pumping block, wherein a supply speed of the molten mixture of the photoinitiator and the epoxy-based thermoplastic resin supplied to the coating device by the action of the pump is adjusted.

4. The dry film photoresist film manufacturing system according to claim 3, further comprising:

a thickness measuring device which is disposed between the coating roller and the laminating roller, measures a thickness of the dry film photoresist layer coated on the base film, and outputs a measured current thickness value to a controller; and the controller which stores a reference thickness value in an internal memory, receives the current thickness value of the dry film photoresist layer from the thickness measuring device, compares the received current thickness value with the reference thickness value stored in the internal memory, and outputs a pumping control signal to the pump station according to a difference between the current thickness value and the reference thickness value, wherein the pump station performs pumping according to the pumping control signal from the controller.

5. The dry film photoresist film manufacturing system according to claim 1, wherein the coating device comprises:

the coating block for receiving the molten mixture from the pump station and spraying the molten mixture to the base film; and a moving block for moving the coating block in a vertical direction, in a back-and-forth direction, and in a horizontal direction, wherein the coating block comprises:

a lower coating block; and an upper coating block coupled to an upper side of the lower coating block, wherein the lower coating block has an inlet connected with the second supply hose of the pump station, wherein the inlet has a supply hole communicating with the inlet and perforating through an upper surface of the lower coating block, wherein a spray gap is formed between the upper surface of the lower coating block and a lower surface of the upper coating block, and wherein the molten mixture supplied to the supply hole is sprayed through the spray gap to coat the base film.

6. The dry film photoresist film manufacturing system according to claim 1, wherein the hot air supply device comprises:

a blower;

a heater box having a heater embedded therein to convert wind introduced from the blower into hot air and discharge the hot air to a nozzle device;

the nozzle device having a plurality of nozzles, and receiving the hot air from the heater box to supply the hot air to a hot air chamber through the nozzles; and the hot air chamber having an inlet which is formed at one side and through which the dry film photoresist film or the base film coated with the dry film photoresist layer is introduced, and an outlet which is formed at another side and through which the dry film photoresist film softened by the hot air is discharged, and including a space for softening the dry film photoresist film at temperature by the hot air supplied from the nozzle device.

7. The dry film photoresist film manufacturing system according to claim 1, wherein the cutting device comprises:

a lower roller which is rotatable; and an upper roller rotating in conjunction with the lower roller, wherein the dry film photoresist film is interposed between the lower roller and the upper roller so that the dry film photoresist film is transferred in one direction by the rotation of the upper roller and the lower roller, wherein a cutting blade is embossed along an outer circumference surface of the upper roller in a rectangular shape, wherein the upper roller is mounted on the lower roller so that the cutting blade embossed along the outer circumference surface of the upper roller gets in contact with an outer circumferential surface of the lower roller, and wherein the dry film photoresist film is cut in the rectangular shape of the cutting blade when the upper roller rotates once so as to produce the plurality of dry film photoresist film chips.

8. The dry film photoresist film manufacturing system according to claim 7, wherein the cutting blade comprises:

a shear blade portion formed at a position where cutting starts;

a pair of lateral blade portions parallel to a transfer direction; and a rear blade portion formed at a front end of the pair of lateral blade portions to be spaced apart from the shear blade portion at a distance of the plurality of dry film photoresist film chips and formed at a rear end of the pair of lateral blade portions to be formed at a position at which the cutting is terminated, and wherein the pair of lateral blade portions are formed inward from left and right edges of the upper roller so as to be cut more inward than the dry film photoresist layer.

9. The dry film photoresist film manufacturing system according to claim 1, further comprising:

a conveying belt mounted to be located at a distance which is identical to or shorter than a length of the plurality of cut dry film photoresist film chips from the upper roller and the lower roller of the cutting device and inclined downward in a transfer direction so as to receive the plurality of dry film photoresist film chips and transfer the plurality of dry film photoresist film chips downwardly when the plurality of dry film photoresist film chips cut by the cutting action of the cutting blade are separated from the base film and the cover film and do a free fall;

a pair of pull-in rollers for exfoliating the base film, which falls to the conveying belt and has residues of the dry film photoresist layer from which the plurality of dry film photoresist film chips are separated, the base film, which pulls the cover film and has the residues of the dry film photoresist layer, and the base film of the cover film;

a base film exfoliating roller located below a rear of the pair of pull-in rollers and converting the direction of the base film exfoliated from the pair of pull-in rollers into a downward direction so that the base film is smoothly exfoliated from the pair of pull-in rollers;

a cover film rewinder for winding the cover film exfoliated from the pair of pull-in rollers; and a collection box located beneath the pair of pull-in rollers for collecting the residues of the dry film photoresist layer separated and falling when the base film and the cover film are separated from each other while passing through the pair of pull-in rollers.

\* \* \* \* \*